United States Patent [19]
De Keyzer et al.

[11] Patent Number: 5,618,650
[45] Date of Patent: Apr. 8, 1997

[54] IMAGING ELEMENT AND METHOD FOR MAKING A PRINTING PLATE ACCORDING TO THE SILVER SALT DIFFUSION TRANSFER

[75] Inventors: René De Keyzer, Waasmunster; Jos Vaes, Betekom, both of Belgium

[73] Assignee: AGFA-Gevaert, N.V., Mortsel, Belgium

[21] Appl. No.: 554,653

[22] Filed: Nov. 8, 1995

[30] Foreign Application Priority Data

Nov. 29, 1994 [EP] European Pat. Off. ............. 94203463

[51] Int. Cl.$^6$ ................. G03C 8/28; G03F 7/07
[52] U.S. Cl. .................. 430/204; 430/231; 430/232; 430/229
[58] Field of Search .................. 430/204, 231, 430/232, 229

[56] References Cited

U.S. PATENT DOCUMENTS

| | | | |
|---|---|---|---|
| 3,345,168 | 10/1967 | Wagner et al. | 430/232 |
| 3,709,687 | 1/1973 | Land | 430/231 |
| 4,621,041 | 11/1986 | Saikawa et al. | 430/204 |
| 5,153,097 | 10/1992 | Nishinoiri et al. | 430/204 |
| 5,445,915 | 8/1995 | Vaes | 430/204 |
| 5,496,679 | 3/1996 | Hauquier et al. | 430/204 |

*Primary Examiner*—Richard L. Schilling
*Attorney, Agent, or Firm*—Breiner & Breiner

[57] ABSTRACT

The present invention provides an imaging element comprising on a support a silver halide emulsion layer and an image receiving layer comprising physical development nuclei being in water permeable contact with said silver halide emulsion layer, characterized in that said image receiving layer comprises a colloidal clay.

According to the invention there is further provided a method for making a lithographic printing plate comprising the steps of image-wise exposing an imaging element as defined above and subsequently developing a thus obtained image-wise exposed imaging element by means of an alkaline processing solution in the presence of a developing agent and a silver halide solvent.

8 Claims, No Drawings

IMAGING ELEMENT AND METHOD FOR MAKING A PRINTING PLATE ACCORDING TO THE SILVER SALT DIFFUSION TRANSFER

DESCRIPTION

1. Field of the Invention

The present invention relates to a method for making a lithographic printing plate according to the silver salt diffusion transfer process.

2. Background of the Invention

The principles of the silver complex diffusion transfer reversal process, hereinafter called DTR process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background. For example, typical lithographic printing plates are disclosed in EP-A-423399 and EP-A-410500.

The DTR-image can be formed in the image-receiving layer of a sheet or web material which is a separate element with respect to the photographic silver halide emulsion material (a so-called two-sheet DTR element) or in the image-receiving layer of a so-called single-support element, also called mono-sheet element, which contains at least one photographic silver halide emulsion layer integral with an image-receiving layer in waterpermeable relationship therewith. It is the latter mono-sheet version which is preferred for the preparation of offset printing plates by the DTR method.

As for other printing plates it is required that the printing plates obtained according to the DTR-process have a high printing endurance, good ink acceptance in the printing areas and no ink acceptance in the non-printing areas (no staining). It is furthermore desirable that the number of copies that have to be disposed of because of ink acceptance in the non-printing areas (so called toning) during start-up of the printing process is limited. It is still further desirable that the printing properties of the plates obtained according to the DTR process are not or only slightly influenced by the exhaustion degree of the processing solution so that a high number of printing plates of the required quality can be obtained in a small volume of processing solution.

With respect to these requirements the state of the transferred silver i.e. the silver formed in the image-receiving layer plays a very important role. Parameters that are known to control the state of the transferred silver are e.g. the rate of development of the exposed silver halide (chemical development), rate of dissolution of the non-exposed silver halide by the silver halide solvent(s), rate of diffusion of the silver halide complexes, rate of development of the silver halide complexes in the image receiving layer (physical development) etc.

Although other factors such as for example the plate construction have some influence on the aforementioned requirements the nature of the physical development nuclei influences the mentioned requirements to a very large extent as is disclosed in EP-A 546,598. However the presence of binders in the layer containing physical development nuclei also seems to have an influence.

U.S. Pat. No. 2,698,237 discloses a DTR-image receiving material comprising an image receiving layer having metal sulfide nuclei precipitated in an aqueous siliciumdioxide dispersion. Said nuclei are reached to show a high activity. Furthermore the presence of hydrophilic organic polymers binders in the layer containing physical development nuclei of a mono-sheet DTR material suitable for preparing a lithographic plate has been disclosed in e.g. U.S. Pat. Nos. 3,728,114; 4,160,670; 4,606,985; 4,510,228; 4,743,525; 4,879,193; 5,153,097; 5,108,871 and 5,041,354.

3. SUMMARY OF THE INVENTION

It is an object of the present invention to provide a DTR-material for making a lithographic printing plate with excellent lithographic printing properties i.a, improved for toning and ink acceptance, surely when processed in an exhausted activator.

It is an object of the present invention to provide a DTR-process for making a lithographic printing plate with excellent printing properties i.a. improved for toning and ink acceptance.

Further objects of the present invention will become clear from the description hereinafter.

According to the present invention there is provided an imaging element comprising on a support a silver halide emulsion layer and an image receiving layer comprising physical development nuclei being in water permeable contact with said silver halide emulsion layer, characterized in that said image receiving layer comprises a colloidal clay.

According to the present invention there is further provided a method for making a lithographic printing plate comprising the steps of image-wise exposing an imaging element as defined above and subsequently developing a thus obtained image-wise exposed imaging element by means of an alkaline processing solution in the presence of a developing agent and a silver halide solvent.

4. DETAILED DESCRIPTION OF THE PRESENT INVENTION

According to the present invention it has been found that a lithographic printing plate prepared according to the DTR-process from an imaging element comprising in the image receiving layer physical development nuclei and colloidal clay has less toning and an improved ink acceptance, especially when processed in an exhausted activator. Preferably the image receiving layer comprises said colloidal clay in an amount in the range from 0.05 mg/m$^2$ to 100 mg/m$^2$, more preferably in an amount in the range from 0.1 mg/m$^2$ to 50 mg/m$^2$, most preferably in an amount in the range from 1 mg/m$^2$ to 10 mg/m$^2$.

Clays are essentially hydrous aluminum silicates, wherein alkali metals or alkaline-earth metals are present as principal constituents. Also in some clay minerals magnesium or iron or both replace the aluminum wholly or in part. The ultimate chemical constituents of the clay minerals vary not only in amounts, but also in the way in which they are combined or are present in various clay minerals. Natural clays are well known, but it is also possible to prepare synthetic clays in the laboratory, so that more degrees of freedom can lead to reproducible tailor made clay products for use in different applications.

So from the natural clays smectite clays, including laponites, hectorites and bentonites are well-known. For the said smectite clays some substitutions in both octahedral and tetrahedral layers of the crystal lattice occur, resulting in a small number of interlayer cations. Smectite clays form a group of "swelling" clays which take up water and organic liquids between the composite layers and which have marked cation exchange capacities. From these smectite clays, synthetic chemically pure clays have been produced.

The clays used in accordance with the invention are preferably smectic clays, more preferably synthetic smectic clays, most preferably synthetic laponites. So preferred synthetic laponite smectite clay additives for the purposes of this invention are e.g. LAPONITE RD, LAPONITE RDS and LAPONITE JS, trade mark products of LAPORTE INDUSTRIES Limited, London.

Said clays and process for the production thereof have been described in EP-Patent 161 411 B1.

LAPONITE JS is described as a synthetic layered hydrous sodium lithium magnesium fluoro-silicate incorporating an inorganic polyphosphate peptiser. LAPONITE RD is described as a synthetic layered hydrous sodium lithium magnesium silicate incorporating an inorganic polyphosphate peptiser. LAPONITE RDS is described as a synthetic layered hydrous sodium lithium magnesium silicate incorporating an inorganic polyphoshate peptiser. The said silicates appear as free flowing white powder and hydrates well in water to give virtually clear and colourless colloidal dispersions of low viscosity, also called "sols".

Preferred development nuclei for use in accordance with the present invention are sulfides of heavy metals e.g. sulfides of antimony, bismuth, cadmium, cobalt, lead, nickel, palladium, platinum, silver, and zinc. Especially preferred development nuclei in connection with the present invention are palladium sulfide nuclei. Other suitable development nuclei are heavy metal salts such as e.g. selenides, polyselenides, polysulphides, mercaptans, and tin (II) halides. Heavy metals, preferably silver, gold, platinum, palladium, and mercury can be used in colloidal form.

Preferably said physical development nuclei have an average diameter less than 6 nm and the number of nuclei having a diameter larger than 4.5 nm is less than 15% of the total number of nuclei. Although the size of the nuclei above is expressed by a diameter this does not imply that the nuclei are necessarily spherical. By diameter is meant the diameter of a sphere having an equivalent volume so that the size of nuclei of a variety of shapes can be characterized by the same parameter.

The physical development nuclei suitable for use according to the present invention may be prepared according to known procedures. For example the heavy metal sulfides can be prepared by adding an aqueous solution of heavy metal ions to a solution containing sulfide ions and optionally a hydrophilic organic binder. The obtained nuclei can be stabilized using a stabilizer. Suitable stabilizer are large organic molecules that readily absorb to the surface of the nuclei. Examples are heterocyclic compounds containing a water solubilizing group such as —COOH, —SO$_3$H or —SO$_2$H e.g. tetrazoles containing a water solubilizing group as described in e.g. EP-A-218752. The colloidal clay according to the invention may then be added to the nuclei containing dispersion at any phase before or during the coating of said dispersion. When the image receiving layer has a thickness of less than 0.05 μm, an aqueous dispersion of the colloidal clay can even be coated on said image receiving layer or the other way around. In this embodiment the physical development nuclei and the colloidal clay remain discrete particles.

The amount of nuclei used in the image receiving layer is preferably between 0.2 mg/m$^2$ and 20 mg/m$^2$, more preferably between 0.4 mg/m$^2$ and 10 mg/m$^2$ preferably between 0.6 mg/m$^2$ and 5 mg/m$^2$.

According to one preferred embodiment of the present invention a lithographic printing plate can be obtained by means of the DTR-process using an imaging element comprising on a support in the order given a silver halide emulsion layer and a layer containing physical development nuclei and a colloidal clay in water permeable relationship with said emulsion layer.

Layers being in waterpermeable contact with each other are layers that are contiguous to each other or only separated from each other by (a) waterpermeable layer(s). The nature of a waterpermeable layer is such that it does not substantially inhibit or restrain the diffusion of water or of compounds contained in an aqueous solution e.g. developing agents or the complexed silver.

Supports suitable for use in accordance with the present invention may be opaque or transparent, e.g. a paper support or resin support. When a paper support is used preference is given to one coated at one or both sides with an Alpha-olefin polymer. It is also possible to use an organic resin support e.g. poly(ethylene terephthalate) film or poly-Alpha-olefin films. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports e.g. aluminum may also be used in accordance with the present invention.

The photosensitive layer used according to the present invention may be any layer comprising a hydrophilic colloid binder and at least one silver halide emulsion, at least one of the silver halide emulsions being photosensitive.

The photographic silver halide emulsion(s) used in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

For use according to the present invention the silver halide emulsion or emulsions preferably consist principally of silver chloride while a fraction of silver bromide may be present ranging from 1 mole % to 40 mole %. Most preferably a silver halide emulsion containing at least 70 mole % of silver chloride is used.

The average size of the silver halide grains may range from 0.10 to 0.70 μm, preferably from 0.25 to 0.45 μm.

Preferably during or after the precipitation stage iridium and/or rhodium containing compounds or a mixture of both are added. The concentration of these added compounds ranges from $10^{-8}$ to $10^{-3}$ mole per mole of AgNO$_3$, preferably between $10^{-7}$ and $10^{-5}$ mole per mole of AgNO$_3$.

The emulsions can be chemically sensitized e.g. by adding sulphur-containing-compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

Apart from negative-working silver halide emulsions that are preferred for their high photosensitivity, use can be made also of direct-positive silver halide emulsions that produce a positive silver image in the emulsion-layer(s) and a negative image on the image-receiving layer.

Suitable direct positive silver-halide emulsions for use accordance with the present invention are silver halide emulsions that have been previously fogged or that mainly form an internal latent image.

Internal latent image-type silver halide emulsions that can be used in accordance with the present invention have been described in e.g. U.S. Pat. Nos. 2,592,250, 3,206,313, 3,271, 157, 3,447,927, 3,511,662, 3,737,313, 3,761,276, GB-A 1,027,146, and JA Patent Publication No. 34,213/77. However, the silver halide emulsions used in the present invention are not limited to the silver halide emulsions described in these documents.

The other type of direct positive type silver halide emulsions for use in accordance with the present invention, which is of the previously fogged type, may be prepared by overall exposing a silver halide emulsion to light and/or by chemically fogging a silver halide emulsion. Chemical fog specks may be formed by various methods for chemical sensitization.

Chemical fogging may be carried out by reduction or by a compound which is more electropositive than silver e.g. gold salts, platinum salts, iridium salts etc., or a combination of both. Reduction fogging of the silver halide grains may occur by high pH and/or low pAg silver halide precipitation or digestion conditions e.g. as described by Wood J. Phot. Sci. 1 (1953), 163 or by treatment with reducing agents e.g. tin(II) salts which include tin(II)chloride, tin complexes and tin chelates of (poly)amino(poly)carboxylic acid type as described in British Patent 1,209,050, formaldehyde, hydrazine, hydroxylamine, sulphur compounds e.g. thiourea dioxide phosphonium salts e.g. tetra(hydroxymethyl)-phosphonium chloride, polyamines e.g. diethylenetriamine, bis(p-aminoethyl)sulfide and its water-soluble salts, hydrazine derivatives, alkali arsenite, amine borane etc. or mixtures thereof.

When fogging of the silver halide grains occurs by means of a reducing agent e.g. thiourea dioxide and a compound of a metal more electropositive than silver especially a gold compound, the reducing agent is preferably used initially and the gold compound subsequently. However, the reverse order can be used or both compounds can be used simultaneously.

In addition to the above described methods of chemically fogging chemical fogging can be attained by using said fogging agents in combination with a sulphur-containing sensitizer, e.g. sodium thiosulphate or a thiocyanic acid compound e.g. potassium thiocyanate.

The silver halide emulsions of the DTR-element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. In case of exposure by an argon ion laser a blue sensitizing dye is incorporated. In case of exposure by a red light emitting source, e.g. a LED or a HeNe laser a red sensitizing dye is used. In case of exposure by a semiconductor laser special spectral sensitizing dyes suited for the near infra-red are required. Suitable infra-red sensitizing dyes are disclosed in i.a. U.S. Pat. Nos. 2,095,854, 2,095,856, 2,955,939, 3,482,978, 3,552,974, 3,573,921, 3,582,344, 3,623,881 and 3,695,888.

A preferred blue sensitizing dye, green sensitizing dye, red sensitizing dye and infra-red sensitizing dye in connection with the present invention are described in EP-A 554,585.

To enhance the sensitivity in the red or near infra-red region use can be made of so called supersensitizers in combination with red or infra-red sensitizing dyes. Suitable supersensitizers are described in Research Disclosure Vol 289, May 1988, item 28952. The spectral sensitizers can be added to the photographic emulsions in the form of an aqueous solution, a solution in an organic solvent or in the form of a dispersion.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds.

The silver halide-emulsions may contain pH controlling ingredients. Preferably the emulsion layer is coated at a pH value near the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787 and DE-P 2,453,217.

More details about the composition, preparation and coating of silver halide emulsions suitable for use in accordance with the present invention can be found in e.g. Product Licensing Index, Vol. 92, December 1971, publication 9232, p. 107–109.

In addition to the above described emulsion layer and image receiving layer other-hydrophilic colloid layers in water permeable relationship with these layers may be present For example it is especially advantageous to include a base-layer between the support and the photosensitive silver halide emulsion layer. In a preferred embodiment said base-layer serves as an antihalation layer. On the other hand, in order to gain sensitivity, light reflecting pigments, e.g. titaniumdioxide can be present. Further this layer can contain hardening agents, matting agents, e.g. silica particles, and wetting agents. At least part of these matting agents and/or light reflection pigments may also be present in the silver halide emulsions layer the most part however preferably being present in said base-layer. As a further alternative the light reflecting pigments may be present in a separate layer provided between the antihalation layer and the photosensitive silver halide emulsion layer.

In a preferred embodiment in connection with this photographic material a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack.

The hydrophilic, layers usually contain gelatin as hydrophilic colloid binder. Mixtures of different gelatins with different viscosities can be used to adjust the rheological properties of the layer. Like the emulsion layer the other hydrophilic layers are coated preferably at a pH value near the isoelectric point of the gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the vinylsulfone type e.g. methylenebis(sulfonylethylene), aldehydes e.g. formaldehyde, glyoxal, and glutaraldehyde, N-methylol compounds e.g. dimethylolurea and methyloldimethylhydantoin, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in US 4,063,952.

Preferably used hardening agents are of the aldehyde type. The hardening agents can be used in wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging element used according to the present invention may further comprise various kinds of surface-active agents in the photographic, emulsion, layer or in at least one other hydrophilic colloid layer. Suitable surface-active agents include non-ionic agents, anionic agents comprising an acid group, ampholytic agents and cationic agents. Preferably compounds containing perfluorinated alkyl groups are used.

This photographic material suitable for use in the present invention may further comprise various other additives such as e.g. compounds improving the dimensional stability of the photographic element, UV-absorbers, spacing agents and plasticizers.

Suitable additives for improving the dimensional stability of the photographic element are e.g. dispersions of a water-soluble or hardly soluble synthetic polymer e.g. polymers of alkyl (meth)acrylates, alkoxy(meth) acrylates, glycidyl (meth)acrylates, (meth)acrylamides, vinyl esters, acrylonitriles olefins, and styrenes, or copolymers of the above with acrylic acids, methacrylic acids, alpha-beta-unsaturated dicarboxylic acids, hydroxyalkyl (meth)acrylates, sulphoalkyl (meth)acrylates, and styrene sulphonic acids.

The imaging element according to said embodiment may be imaged by means of a wide choice of cameras, existing on the market. Horizontal, vertical and darkroom type cameras and contact-exposure apparatus are available to suit any particular class of reprographic work. The imaging element can also be exposed in accordance with the present invention with the aid of i.a. laser recorders and cathode ray tubes.

Subsequently, said photographic material is developed with the aid of an aqueous alkaline solution in the presence of (a) developing agent(s) and (a) silver halide solvent(s).

The alkaline processing liquid used for developing the imaging element in accordance with the method of the present invention preferably contains a silver halide solvent. Preferably the silver halide solvent is used in an amount between 0.01% by weight and 10% by weight and more preferably between 0.05% by weight and 8% by weight. Suitable silver halide solvents for use in connection with the present invention are e.g. 2-mercaptobenzoic acid, cyclic imides, oxazolidones and thiosulfates. Silver halide solvents that are preferably used in connection with the present invention are thiocyanates and alkanolamines.

Alkanolamines that are suitable for use in connection with the present invention may be of the tertiary, secondary or primary type. Examples alkanolamines, that may be used in connection with the present invention correspond to the following formula:

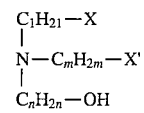

wherein X and X' independently represent hydrogen, a hydroxyl group or an amino group, l and m represent 0 or integers of 1 or more and n represents an integer of 1 or more. Preferably used alkanolamines are e.g. N-(2-aminoethyl)ethanolamine, diethanolamine, N-methlethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol etc. or mixtures thereof.

According to the present invention the alkanolamines are preferably present in the alkaline processing liquid. However part or all of the alkanolamine can be present in one or more layers of the imaging element.

A further suitable type of silver halide solvents are thioether compounds. Preferably used thioethers correspond to the following general formula:

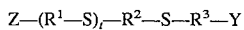

wherein Z and Y each independently represents hydrogen, an alkyl group, an amino group, an ammonium group, a hydroxyl, a sulfo group, a carboxyl, an aminocarbonyl or an aminosulfonyl, $R^1$, $R^2$ and $R^3$ each independently represents an alkylene that may be substituted and optionally contain an oxygen bridge and t represents an integer from 0 to 10. Examples of thioether compounds corresponding to the above formula are disclosed in e.g. U.S. Pat. No. 4,960,683 and EP-A 547,662, which therefor are incorporated herein by reference.

Still further, suitable silver halide solvents are meso-ionic compounds. Preferred meso-ionic compounds for use in connection with the present invention are triazolium thiolates and more preferred 1,2,4-triazolium-3-thiolates.

According to a preferred embodiment of the present invention at least part and most preferably all of the meso-ionic compound is present in the alkaline processing liquid used for developing the image-wise exposed imaging element. Preferably the amount of meso-ionic compound in the alkaline processing liquid is between 0.1 mmol/l and 25 mmol/l and more preferably between 0.5 mmol/l and 15 mmol/l and most preferably between 1 mmol/l and 8 mmol/l.

However the meso-ionic compound may be incorporated in one or more layers comprised on the support of the imaging element. The meso-ionic compound is in that case preferably contained in the imaging element in a total amount between 0.1 and 10 mmol/m², more preferably between 0.1 and 0.5 mmol/m² and most preferably between 0.5 and 1.5 mmol/m². More details are disclosed in EP-A-0,554,585

The alkaline processing liquid used in accordance with the present invention preferably has a pH between 9 and 14 and more preferably between 10 and 13. Said pH may be established by an organic or inorganic alkalines substance are a combination thereof. Suitable inorganic alkaline substances are e.g. potassium or sodium hydroxide, carbonate, phosphate etc. Suitable organic alkaline substances are e.g. alkanolamines. In the latter case the alkanolamines will provide or help maintain the pH and serve as a silver halide complexing agent.

The alkaline processing liquid may also contain (a) developing agent(s). In this case the alkaline processing liquid is called a developer. On the other hand some or all of the developing agent(s) may be present in one or more layers of the photographic material or imaging element. When all of the developing agents are contained in the imaging element the alkaline processing liquid is called an activator or activating liquid.

Silver halide developing agents for use in accordance with the present invention are preferably of the p-dihydroxybenzene type, e.g. hydroquinone, methylhydroquinone or chlorohydroquinone, preferably in combination, with an auxiliary developing agent being a 1-phenyl-3-pyrazolidinone-type developing agent and/or p-monomethylaminophenol. Particularly useful auxiliary developing agents are the 1-phenyl-3-pyrazolidinones. Even more preferred, particularly when they are incorporated into the photographic material are 1-phenyl-3-pyrazolidinones of which the aqueous solubility is increased by a hydrophilic substituent such as e.g. hydroxy, amino, carboxylic acid group, sulphonic acid group etc. Examples of 1-phenyl-3-pyrazolidinones substituted with one or more hydrophilic groups are e.g. 1-phenyl-4,4-dimethyl-2-hydroxy-3pyrazolidone, 1-(4-carboxyphenyl)-4,4-dimethyl-3-pyrazolidone etc. However other developing agents can be used.

At least the auxiliary developing agents are preferably incorporated into the photographic material, preferably in the silver halide emulsion layer of the photographic material, in an amount of less than 150 mg/g of silver halide expressed as AgNO₃, more preferably in an amount of less than 100 mg/g of silver halide expressed as AgNO₃.

According to the present invention the alkaline processing liquid used for developing an imaging element as described above preferably also contains hydrophobizing agents for improving the hydrophobicity of the silver image obtained in the image receiving layer. The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl group containing at least 3 carbon atoms. Examples of hydrophobizing agents for use in accordance with the present invention are e.g. those described in U.S. Pat. No. 3,776,728, and U.S. Pat. No. 4,563,410. Preferred compounds correspond to one of the following formulas:

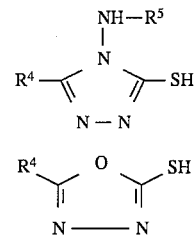

wherein $R^5$ represents hydrogen or an acyl group, $R^4$ represents alkyl, aryl or aralkyl. Most preferably used compounds are compounds according to one of the above formulas wherein $R^4$ represents an alkyl containing 3 to 16 C-atoms.

According to the present-invention the hydrophobizing agents are contained in the alkaline processing liquid in an amount of at least 0.1 g/l, more preferably at least 0.2 g/l and most preferably at least 0.3 g/l. The maximum amount of hydrophobizing agents will be determined by the type of hydrophobizing agent, type and amount of silver halide solvents etc. Typically the concentration of hydrophobizing agent is preferably not more than 1.5 g/l and more preferably not more than 1 g/l.

The alkaline processing liquid preferably also contains a preserving agent having antioxidation activity, e.g. sulphite ions provided e.g. by sodium or potassium sulphite. For example, the aqueous alkaline solution comprises sodium sulphite in an amount ranging from 0.15 to 1.0 mol/l. Further may be present a thickening agent, e.g. hydroxyethylcellulose and carboxymethylcellulose, fog inhibiting agents, e.g. potassium bromide, potassium iodide and a benzotriazole which is known to improve the printing endurance, calcium-sequestering compounds, anti-sludge agents, and hardeners including latent hardeners. In accordance with the present invention it is furthermore preferred-to use a spreading agent or surfactant in the alkaline processing liquid to assure equal spreading of the alkaline processing liquid over the surface of the photographic material. Such a surfactant should be stable at the pH of the alkaline processing liquid and should assure a fast overall wetting of the surface of the photographic material. A surfactant suitable for such purpose is e.g. a fluor containing surfactant such as e.g. $C_7F_{15}COONH_4$. It is furthermore advantageous to add glycerine to the alkaline processing liquid so as to prevent crystallization of dissolved components of said alkaline processing liquid.

Development acceleration can be accomplished by addition of various compounds to the alkaline processing liquid and/or one or more layers of the photographic element, preferably polyalkylene derivatives having a molecular weight of at least 400 such as those described in e.g. U.S. Pat. Nos. 3,038,805-4,038,075-4,292,400-4,975,354.

Subsequent to the development in an alkaline processing liquid in accordance with the present invention the surface of the printing plate is preferably neutralized using a neutralization liquid.

A neutralization liquid generally has a pH between 5 and 8. The neutralization liquid preferably contains a buffer e.g. a phosphate buffer, a citrate buffer or mixture thereof. The neutralization solution can further contain bactericides, substances which influence the hydrophobic hydrophilic balance of the printing plate obtained after processing of the DTR element, e.g. hydrophobizing agents as described above, silica and wetting agents, preferably compounds containing perfluorinated alkyl groups.

A lithographic plate is thus obtained.

According to another preferred embodiment of the present invention a lithographic printing plate can be obtained by means of the DTR-process using an imaging element comprising in the order given a hydrophilic surface of a support, an image receiving layer containing physical development nuclei and a colloidal clay and a silver halide emulsion layer in water permeable relationship with said image receiving layer.

Said hydrophilic surface of a support can be a hardened hydrophilic layer, containing a hydrophilic binder and a hardening agent coated on a flexible support, an image receiving layer Such hydrophilic binders are disclosed in e.g. EP-A 450,199, which therefor is incorporated herein by reference. Preferred hardened hydrophilic layers comprise partially modified dextrans or pullulan hardened with an aldehyde as disclosed in e.g. EP-A 514,990 which therefor is incorporated herein by reference. More preferred hydrophilic layers are layers of polyvinyl alcohol hardened with a tetraalkyl orthosilicate and preferably containing $SiO_2$ and/or $TiO_2$ wherein the weight ratio between said polyvinylalcohol and said tetraalkyl orthosilicate is between 0.5 and 5 as disclosed in e.g. GB-P 1,419,512, FR-P 2,300,354, U.S. Pat. No. 3,971,660, U.S. Pat. No. 4,284,705, EP-A 405,016 and EP-A 450,199 which therefor are incorporated herein by reference.

Flexible supports e.g. a paper support or a resin support are described above.

Said hydrophilic surface of a support is preferably a hydrophilic metallic support e.g. an aluminum foil.

The aluminum support of the imaging element for use in accordance with the present invention can be made of pure aluminum or of an aluminum alloy, the aluminum content of which is at least 95%. The thickness of the support usually ranges from about 0.13 to about 0.50 mm.

The preparation of aluminum or aluminum alloy foils for lithographic offset printing comprises the following steps: graining, anodizing, and optionally sealing of the foil.

Graining and anodization of the foil are necessary to obtain a lithographic printing plate that allows to produce high-quality prints in accordance present invention. Sealing is not necessary but may still improve the printing results. Preferably the aluminum foil has a roughness with a CLA value between 0.2 and 1.5 μm, an anodization layer with a thickness between 0.4 and 2.0 μm and is sealed with an aqueous bicarbonate solution.

According to the present invention the toughening of the aluminum foil can be performed according to the methods well known in the prior art. The surface of the aluminum substrate can be roughened either by mechanical, chemical or electrochemical graining or by a combination of these to obtain a satisfactory adhesiveness of a silver halide emulsion layer to the aluminum support and to provide a good water retention property to the areas that will form the non-printing areas on the plate surface.

The electrochemical graining process is preferred because it can form a uniform surface roughness having a large average surface area with a very fine and even grain which is commonly desired when used for lithographic printing plates.

Electrochemical graining can be conducted in a hydrochloric and/or nitric acid containing electrolyte solution using an alternating or direct current. Other aqueous solutions that can be used in the electrochemical graining are e.g. acids like $H_2SO_4$, $H_3PO_4$, that if desired, contain additionally one or more corrosion inhibitors such as $Al(NO_3)_3$, $AlCl_3$, boric acid, chromic acid, sulfates, chlorides, nitrates, monoamines, diamines, aldehydes, phosphates, $H_2O_2$, etc. . . .

Electrochemical graining in connection with the present invention can be performed using single-phase and three-phase alternating current. The voltage applied to the aluminum plate is preferably 10–35 V. A current density of 3–150 Amp/dm$^2$ is employed for 5–240 seconds. The temperature of the electrolytic graining solution may vary from 5°–50° C. Electrochemical graining is carried out preferably with an alternating current from 10 Hz to 300 Hz.

The roughening is preferably preceded by a degreasing treatment mainly for removing fetty substances from the surface of the aluminum foil.

Therefore the aluminum foil may be subjected to a degreasing treatment with a surfactant and/or an aqueous alkaline solution.

Preferably toughening is followed by a chemical etching step using an aqueous solution containing an acid. The chemical etching is preferably carried out at a temperature of at least 30° C. more preferably at least 40° C. and most preferably at least 50° C.

Suitable acids for use in the aqueous etch solution are preferably inorganic acids and most preferably strong acids. The total amount of acid in the aqueous etch solution is preferably at least 150 g/l. The duration of chemical etching is preferably between 3 s and 5 min.

After toughening and optional chemical etching the aluminum foil is anodized which may be carried out as follows.

An electric current is passed through the grained aluminum foil immersed as an anode in a solution containing sulfuric acid, phosphoric acid, oxalic acid, chromic acid or organic acids such as sulfamic, benzosulfonic acid, etc. or mixtures thereof. An electrolyte concentration from 1 to 70% by weight can be used within a temperature range from 0°–70° C. The anodic current density may vary from 1–50 A/dm$^2$ and a voltage within the range 1–100 V to obtain an anodized film weight of 1–8 g/m$^2$ $Al_2O_3.H_2O$. The anodized aluminum foil may subsequently be rinsed with demineralised water within a temperature range of 10°–80° C.

After the anodizing step sealing may be applied to the anodic surface. Sealing of the pores of the aluminum oxide layer formed by anodization is a technique known to those skilled in the art of aluminum anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminum". Different types of sealing of the porous anodized aluminum surface exist.

Preferably, said sealing is performed by treating a grained and anodized aluminum support with an aqueous solution containing a bicarbonate as disclosed in EP-A 567178, which therefor is incorporated herein by reference.

Preferably each of the above described steps is separated by a rinsing step to avoid contamination of the liquid used in a particular step with that of the preceding step.

To promote the image sharpness and, as a consequence thereof, the sharpness of the final printed copy, the anodization layer may be coloured in the mass with an antihalation dye or pigment e.g. as described in JA-Pu-58-14,797.

The imaging element of the present-embodiment may be imaged using a camera-exposure or a scanning exposure as described above followed by a development step in the presence of development agent(s) and silver halide solvent(s) according to the invention so that a silver image is formed in the physical development nuclei layer. Subsequently the silver halide emulsion layer and any other optional hydrophilic layers are removed by e.g. rinsing the imaged element with water, preferably between 30° C. and 50° C. so that the silver image is exposed.

To facilitate the removal of the silver halide emulsion layer it is advantageous to provide a layer between the hydrophilic surface of a support and the silver halide emulsion layer comprising a hydrophilic non-proteinic film-forming polymer e.g. polyvinyl alcohol, polymer beads e.g. poly(meth)acrylate beads or mixtures thereof. Such type of layers are disclosed in EP-A-483415 and EP-A-410500.

Finally said exposed imaged surface of the hydrophilic support is treated with a finisher to enhance the water-receptivity of the non-image areas and to make the image areas oleophilic ink-receptive.

The lithographic composition often called finisher comprises at least one compound enhancing the ink-receptivity and/or lacquer-receptivity of the silver image and at least one compound that improves the ink-repelling characteristics of the hydrophilic surface.

Suitable-ingredients for the finisher are e.g. organic compounds containing a mercapto group such as the hydrophobizing compounds referred to hereinbefore for the alkaline solution. Said (a) hydrophobizing agent(s) is(are) comprised in the finisher preferably in a total concentration between 0.1 g/l and 10 g/l, more preferably in a total concentration between 0.3 g/l and 3 g/l.

Additives improving the oleophilic ink-repellency of the hydrophilic surface areas are e.g. carbohydrates such as acid polysaccharides like gum arabic, carboxymethylcellulose, sodium alginate, propylene glycol ester of alginic acid, hydroxyethyl starch, dextrin,-hydroxyethylcellulose, polyvinyl pyrrolidone, polystyrene sulphonic acid, polyvinyl alcohol and preferably polyglycols, being the reaction products of ethyleneoxide and/or propyleneoxide with water or an alcohol. Optionally, hygroscopic substances e.g. sorbitol, glycerol, tri(hydroxyethyl)ester of glycerol, and turkey red oil may be added.

The following examples illustrate the present invention without limiting it thereto. All percentages are by weight-unless stated otherwise.

EXAMPLE 1

(comparative example)
Preparation of a silver halide emulsion:

A gelatino silver halide emulsion was prepared by double jet precipitation by slowly mixing with stirring an aqueous solution of $AgNO_3$ having a concentration of 2 mole/l, and an aqueous solution having a concentration of 1.7 mole/l of NaCl, 0.48 mole/l of KBr and 0.001 mole/l of KI. Before the precipitation $5.10^{-4}$ mole/l of sodium hexachlororhodaat was added to the silver nitrate solution. In a second part of the precipitation an aqueous solution of $AgNO_3$ having a concentration of 1 mole/l was slowly mixed with an aqueous solution of NaCl at a concentration of 1.3 mole/l.

The temperature during the silver halide formation was 55° C.

The obtained core-shell emulsion was cooled, flocculated and washed. Gelatin was added in an amount sufficient to reach a ratio of ⅔ by weight of gelatin to silver halide, expressed as equivalent amount of silver nitrate. Subsequently a chemical ripening was carried out in a conventional way known to those skilled in the art using thiosulphate and gold salts. Finally the emulsion was sensitized for the red spectral region (600–700 nm).

Preparation of the physical development nuclei:

A coating solution containing PdS nuclei was prepared as follows.

| | |
|---|---|
| Solution A (20° C.): $(NH_4)_2PdCl_4$ | 1.74 g |
| polyvinyl alcohol (1% solution in water) | 20 ml |
| water | 380 ml |
| Solution B (20° C.): $Na_2S.9H_2O$ | 1.61 g |
| polyvinyl alcohol (1% solution in water) | 20 ml |
| water | 380 ml |
| Solution C (20° C.): $Na_2S.9H_2O$ | 3.23 g |
| polyvinyl alcohol (1% solution in water) | 40 ml |
| water | 760 ml |

Solution A and B were simultaneously added to solution C at a rate of 100 ml/min. whilst stirring solution C at 400 rpm. To remove the excess sulphide the obtained mixture was dialysed using a hollow fiber dialyser having a surface of 1.5 m² and a molecular cut-off of 8000. The solution containing the PdS-nuclei was pumped through the dialyser with a delivery of 400 ml/min. and water flows around the fibers with a delivery of 400 ml/min. The solution was brought to a conductivity of 0.5 mS and the pH was kept between 7.2 and 7.8.

The size of the obtained nuclei and their distribution was measured using Transmission Electron Microscopy. It was found that about 2% of the nuclei have a diameter more than 4.5 nm while the average diameter is 1.8 nm.

Preparation of the imaging elements:

A polyethylene terephthalate film support provided on both sides with a adhesion improving layer was coated on both sides with an intermediate layer containing gelatin in an amount of 0.4 g/m² and colloidal silica having an average particle diameter of 7 nm in an amount of 0.4 g/m². The adhesion improving layer contained a copolymer of itaconic acid (2%), vinylidene chloride (88%) and methylmethacrylate (10%) at a total coverage of about 0.2 g/m².

Photographic DTR mono-sheet materials were prepared as follows. One side of the above described polyethylenenterephthalate film support was coated with two layers by a double layer coating technique the layer nearer to the support being the antihalation layer and the other being the emulsion layer. The emulsion was coated at an amount of silver halide corresponding to 1.5 g $AgNO_3$/m². This emulsion layer contained 0.2 g/m² of hydroquinone, 0.1 g/m² of 1-phenyl-3-pyrazolidinone and 1.0 g/m² of gelatin.

The antihalation layer contained 0.1 g/m² of carbon black, 0.82 g/m² of silica particles of 5 μ average size, 2.6 g/m² of titanium oxide and 3 g/m² of gelatin.

After drying these layers were subjected to a temperature of 40° C. for 5 days and then overcoated with a layer containing 0.8 mg/m² PdS nuclei. The layer further contained hydroquinone at 0.4 g/m² and formaldehyde at 100 mg/m².

Different imaging elements were prepared according to the above procedure by varying the kind and amount of compounds added to the coating solution containing PdS nuclei at 30 min. before said coating. The details of these imaging elements are set out in table 1.

TABLE 1

| Material | Compound[a] | Amount |
|---|---|---|
| I | NONE | |
| II | LAPONITE RD | 0.133 mg/m² |

TABLE 1-continued

| Material | Compound[a] | Amount |
| --- | --- | --- |
| III | LAPONITE RD | 1.33 mg/m² |
| IV | LAPONITE JS | 0.133 mg/m² |
| V | LAPONITE JS | 1.33 mg/m² |
| VI | LAPONITE RD | 1.33 mg/m² |
| VII | LAPONITE JS | 1.33 mg/m² |
| VIII | LAPONITE JS | 3.33 mg/m² |
| IX | KIESELSOL 300 F | 1.20 mg/m² |
| X | KIESELSOL 300 F | 4.00 mg/m² |

[a] LAPONITE RD and LAPONITE JS are laponite clays, manufactured by Laporte Industries Ltd, U.K.. KIESELSOL 300 F is a colloidal siliciumdioxide with a specific surface of 300 m²/g, manufactured by Bayer AG, Germany.

The following processing solutions were prepared:

| Activator solution | |
| --- | --- |
| sodium hydroxide | 30 g |
| sodium sulphite anh. | 33 g |
| potassium thiocyanate | 20 g |
| 3-mercapto-4-acetamido-5-n.heptyl-1,2,4-triazole | 0.15 g |
| water to make | 1000 ml |
| Neutralization solution | |
| citric acid | 10 g |
| sodium citrate | 35 g |
| cysteine | 1 g |
| sodium sulphite anh. | 5 g |
| phenol | 50 mg |
| water to make | 100 ml |
| Dampening solution | |
| water | 880 ml |
| citric acid | 6 g |
| boric acid | 8.4 g |
| sodium sulphate anh. | 25 g |
| ethyleneglycol | 100 g |
| colloidal silica | 28 g |

Each of the DTR materials as described above was image-wise exposed in a HeNe laser containing image-setter and was subsequently treated with a fresh above-described activator solution for 15 seconds at 30° C., thereupon treated with the described neutralization solution at 25° C. and finally dried, giving a first set of printing plates, A different set of the imaging elements I to V were also treated as described above with the exception that they were developed in the above described activator solution wherein about 8 m² of imaging material was already processed, giving a second set of printing plates.

The printing plates thus prepared from the imaging elements I to V were used for printing in an identical way. The results are given in table 2.

The toning was determined by mounting the inked-up printing plates of the first set on an offset printing machine (GTO 52—trade name for offset printing machine manufactured by Heidelberg, Germany) and printing 500 copies. During the printing run VAN SON RB 2329 was used as ink and a solution containing 2% of the described dampening solution and 10% of isopropanol was used as dampening liquid in each case. The given number is the first acceptable page that is obtained at these printing conditions, The ink acceptance was determined by mounting the printing plates of the second set on an offset printing machine (AB DICK 9850—trade;name for offset printing machine manufactured by AB Dick Co., U.S.A.) and printing 100 copies. During the printing run AB DICK 1020 was-used as ink and a solution containing 5% of the described dampening solution and 15% of isopropanol was used as dampening liquid in each case. The given number is the first acceptable page that is obtained at these printing conditions.

TABLE 2

| Material | Toning | Ink Acceptance |
| --- | --- | --- |
| I | 500 | 25 |
| II | 450 | 15–20 |
| III | 300 | 15–20 |
| IV | 400 | 10 |
| V | 250 | 10 |

A third and fourth set of printing plates were prepared from the imaging elements I and VI to X in a way as described for the preparation of the first set of printing plates. The results of printing with these sets are given in table 3.

The toning was determined by mounting the inked-up printing plates of the third set on an offset printing machine (GTO 46—trade name for offset printing machine manufactured by Heidelberg, Germany) and printing 500 copies. During the printing run AB DICK 1020 was used as ink and a solution containing 5% of the described dampening solution and 10% of isopropanol was used as dampening liquid in each case. The given number was the first acceptable page that is obtained at these printing conditions.

The dot decrease was determined by mounting the printing plates of the fourth set on an offset printing machine (AB DICK 9850—trade name for offset printing machine manufactured by AB Dick Co., U.S.A.) and printing 10000 copies. During the printing run AB DICK 1020 was used as ink and a solution containing 5% of the described dampening solution and 15% of isopropanol was used as dampening liquid in each case. The given number was the percentual decrease in tone value at the 20% dot between the $50^{th}$ and the $10000^{th}$ copie.

TABLE 3

| Material | Toning | Dot decrease (%) |
| --- | --- | --- |
| I | 225 | 3 |
| VI | 125 | 3 |
| VII | 150 | 4 |
| VIII | 25–50 | 4 |
| IX | 225 | — |
| X | 175 | 6 |

It is clear from the results in table 2 and table 3 that a printing plate obtained from imaging element I (comparison element) gave a (much) higher toning than printing plates obtained from imaging elements II to VIII (imaging elements according to the invention). The use of colloidal siliciumdioxide in a rather high amount gave also a slight lowering of the toning but with an already noticeable decrease in tone value.

It is also clear from the results in table 2 that the ink acceptance of a printing plate obtained by processing imaging element I (comparison element) in an exhausted activator was clearly worse than the ink acceptance of a printing plate obtained by processing imaging elements II to V (imaging elements according to the invention) in-an exhausted activator.

We claim:

1. An imaging element comprising on a support a silver halide emulsion layer and an image receiving layer comprising physical development nuclei being in water permeable contact with said silver halide emulsion layer, characterized in that said image receiving layer comprises a colloidal clay selected from the group consisting of synthetic smectite clay and synthetic laponite clay.

2. An imaging element according to claim 1 wherein said image receiving layer comprises a colloidal clay in an amount in the range from 0.05 mg/m$^2$ to 100 mg/m$^2$.

3. An imaging element according to claim 1 wherein said image receiving layer comprises a colloidal clay in an amount in the range from 0.1 mg/m$^2$ to 50 mg/m$^2$.

4. An imaging element according to claim 1 wherein said image receiving layer comprises a colloidal clay in an amount in the range from 1 mg/m$^2$ to 10 mg/m$^2$.

5. An imaging element according to claim 1 wherein said physical development nuclei have an average diameter less than 6 rim and the number of nuclei having a diameter larger than 4.5 nm is less than 15% of the total number of nuclei.

6. An imaging element according to claim 1 wherein said physical development nuclei comprise sulfides of a heavy metal.

7. An imaging element according to claim 6 wherein said physical development nuclei comprise palladium sulfide.

8. A method for making a lithographic printing plate comprising the steps of image-wise exposing an imaging element as defined in claim 1 and subsequently developing a thus obtained image-wise exposed imaging element by means of an alkaline processing solution in the presence of a developing agent and a silver halide solvent.

* * * * *